(12) United States Patent
Aoki

(10) Patent No.: US 7,449,772 B2
(45) Date of Patent: Nov. 11, 2008

(54) CHIP-TYPE ELECTRONIC COMPONENT INCLUDING THIN-FILM CIRCUIT ELEMENTS

(75) Inventor: Yutaka Aoki, Ome (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 11/804,160

(22) Filed: May 17, 2007

(65) Prior Publication Data

US 2007/0267659 A1    Nov. 22, 2007

(30) Foreign Application Priority Data

May 19, 2006 (JP) ............................. 2006-139684

(51) Int. Cl.
H01L 23/52 (2006.01)
H01L 23/48 (2006.01)
H01L 23/04 (2006.01)
H01L 23/053 (2006.01)

(52) U.S. Cl. .................. 257/691; 257/697; 257/698; 257/700; 257/E23.019; 257/E23.021

(58) Field of Classification Search .................. 257/690, 257/691, 693, 697, 698, 700, 723, E23.019, 257/E23.021

See application file for complete search history.

(56) References Cited

U.S. PATENT DOCUMENTS

2006/0006516 A1*    1/2006   Funaba et al. ............... 257/686

FOREIGN PATENT DOCUMENTS

JP          3465617 B2        8/2003

* cited by examiner

Primary Examiner—Ngan Ngo
(74) Attorney, Agent, or Firm—Frishauf, Holtz, Goodman & Chick, P.C.

(57) ABSTRACT

A chip-type electronic component includes a substrate, a common potential layer formed on an upper side of the substrate, an insulating film formed on the common potential layer, and provided to expose at least part of the common potential layer. At least one common potential electrode is provided on the exposed part of the common potential layer, and a plurality of conductors provided on the insulating film, each of the conductors forming a part of a thin-film circuit element. At least one columnar electrode is electrically connected to at least one of the conductors, and a sealing film is formed around the columnar electrode.

14 Claims, 3 Drawing Sheets

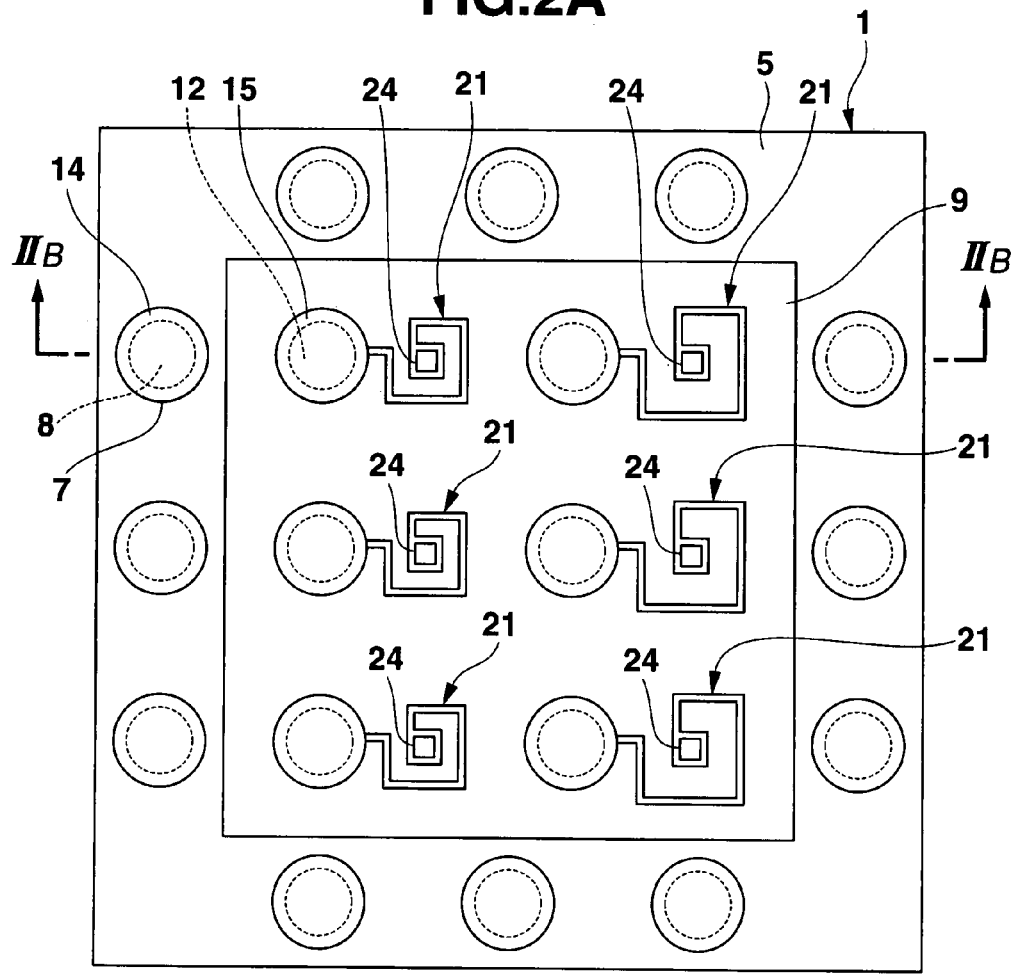
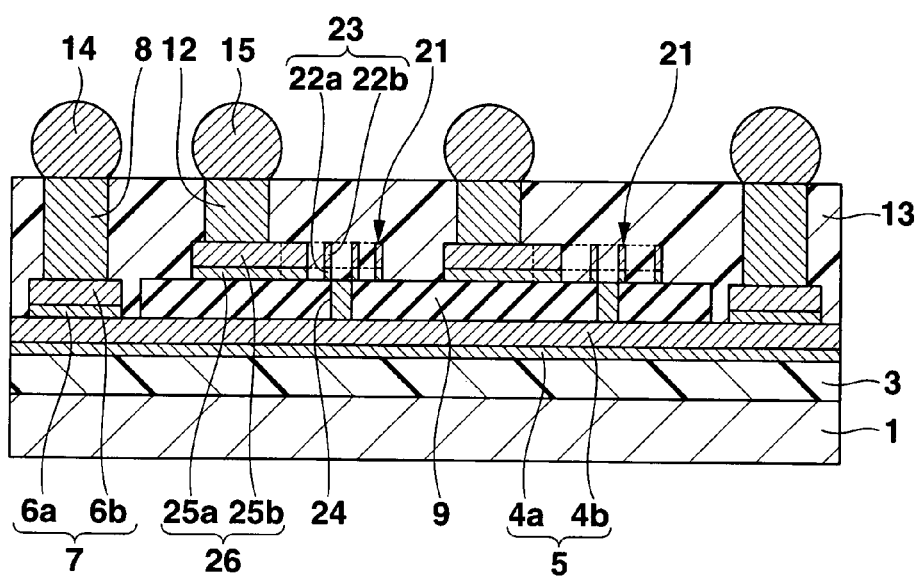

CHIP-TYPE ELECTRONIC COMPONENT INCLUDING THIN-FILM CIRCUIT ELEMENTS

CROSS-REFERENCE TO RELATED APPLICATIONS

This application is based upon and claims the benefit of priority from prior Japanese Patent Application No. 2006-139684, filed May 19, 2006, the entire contents of which are incorporated herein by reference.

BACKGROUND OF THE INVENTION

1. Field of the Invention

The present invention relates to an electronic component such as a semiconductor device including a plurality of thin-film circuit elements.

2. Description of the Related Art

There has been known Japanese Patent No. 3465617 disclosing a semiconductor device configured in a manner that a thin-film circuit element is integrally formed on a semiconductor substrate formed with an integrated circuit. The semiconductor device described in the foregoing known Publication includes a first insulating film formed on the semiconductor substrate formed with an integrated circuit, a ground layer partially formed on the first insulating film, and a second insulating film formed on the ground layer and the first insulating film. A plurality of ground connection pads are electrically connected to the ground layer and the thin-film circuit element is formed on the second insulating film. A ground columnar electrode and a conducting columnar electrode are formed on the ground connection pad and the thin-film circuit element, respectively. A sealing film is formed around the ground and conducting columnar electrodes so that its upper surface is flush with the upper surfaces of ground and conducting columnar electrodes.

The foregoing conventional semiconductor device has the following problem. One thin-film circuit element is formed on the semiconductor substrate; for this reason, packaging density is low. As shown in FIG. 9 of the foregoing patent Publication, the following problem further arises when the thin-film circuit element is a thin-film capacitive element. Namely, the thin-film capacitive element comprises a bottom electrode, an insulating film and a top electrode, which are successively stacked on the second insulating film formed on the ground layer and the first insulating film. Thus, the layer structure of the thin-film capacitive element including the ground layer is complicated. Specifically, five layers, that is, the ground layer, the second insulating film, the bottom electrode, the insulating film and the top electrode, must be formed. As a result, the number of layers increases, and simultaneously, the number of manufacturing processes increases.

BRIEF SUMMARY OF THE INVENTION

An object of the present invention is to provide a semiconductor device, which can make high packaging density.

Another object of the present invention is to provide a semiconductor device, which can reduce the number of manufacturing processes.

According to one aspect of the present invention, there is provided a chip-type electronic component comprising:

a substrate;

a common potential layer formed on an upper side of the substrate;

an insulating film formed on the common potential layer, and provided to expose at least part of the common potential layer;

at least one common potential electrode provided on the exposed part of the common potential layer;

a plurality of conductors provided on the insulating film, each of the conductors forming a part of a thin-film circuit element;

at least one columnar electrode electrically connected to at least one of the conductors; and a sealing film formed around the columnar electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2A is a transparency plan view showing a semiconductor device according to a second embodiment of the present invention;

FIG. 2B is a cross-sectional view taken along the line $II_B$-$II_B$ of FIG. 2A;

DETAILED DESCRIPTION OF THE INVENTION

First Embodiment

Figure 1A:
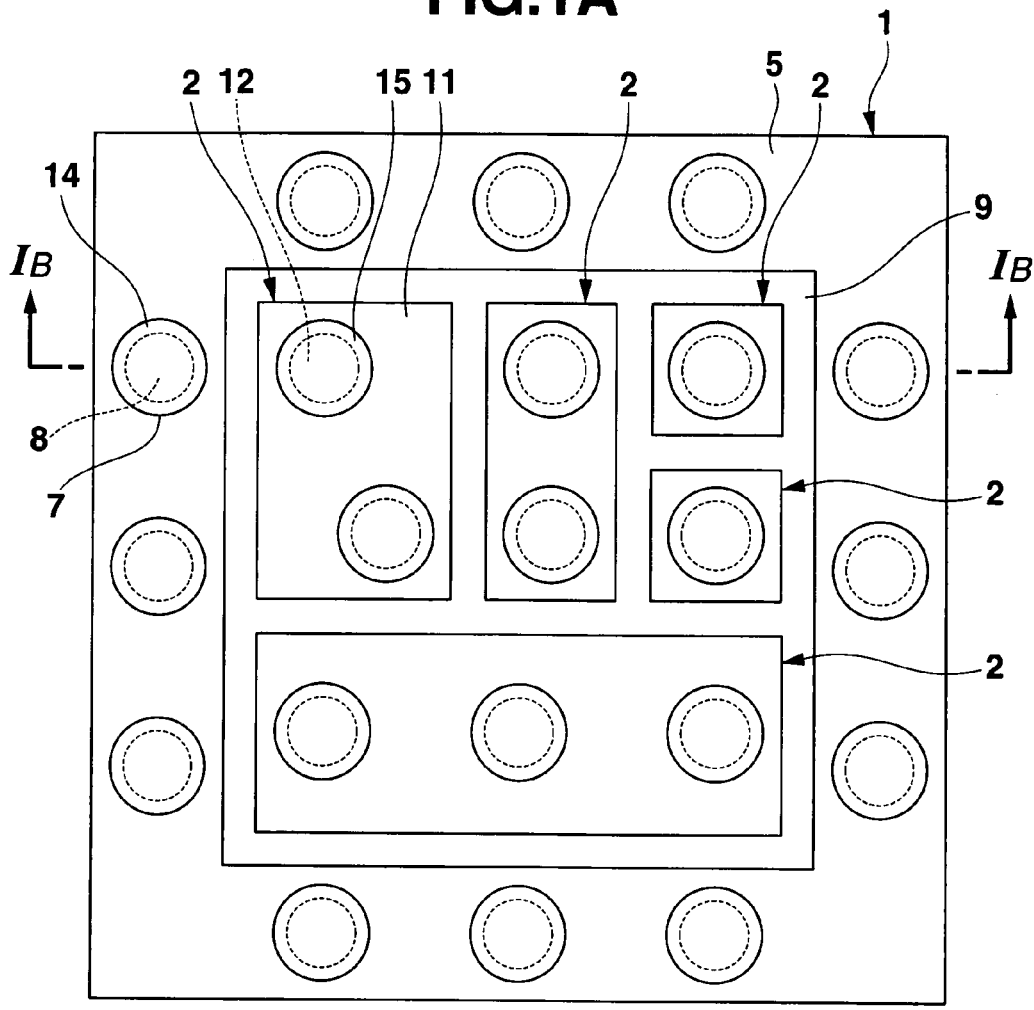
FIG. 1A is a transparency plan view showing a semiconductor device according to a first embodiment of the present invention.
Figure 1B:
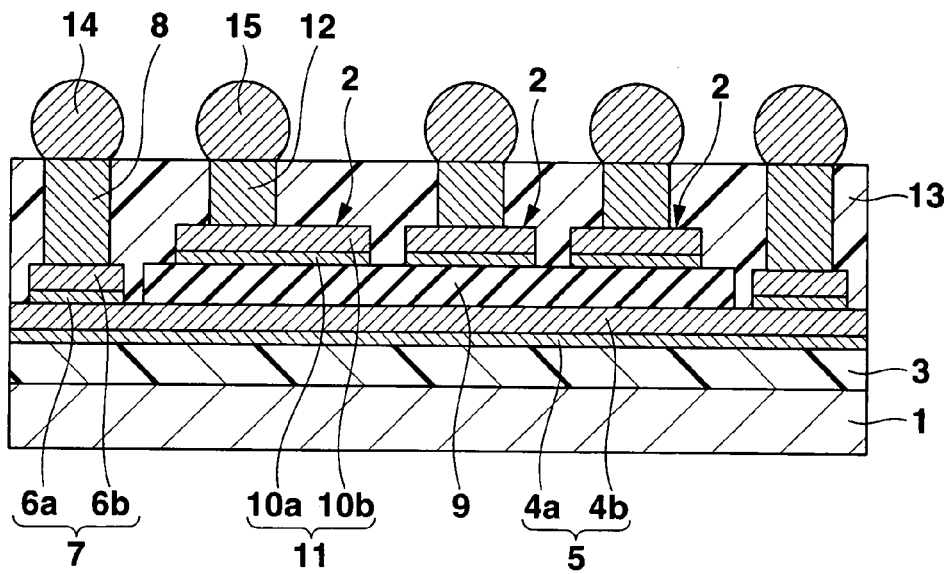
FIG. 1B is a cross-sectional view taken along the line $I_B$-$I_B$ of FIG. 1A.

FIG. 1A is a transparency plan view showing a semiconductor device (chip-type electronic component) according to a first embodiment of the present invention. FIG. 1B is a cross-sectional view taken along the line $I_B$-$I_B$ of FIG. 1A. In brief, the semiconductor device includes a plurality of, for example, five, square (view from a top side) thin-film capacitive elements 2 formed in a center region on a square substrate 1.

The square semiconductor substrate 1 is made of a semiconductor such as silicon, and formed with an integrated circuit (not shown). An under-layer insulating film 3 made of an insulating material such as polyimide resin is formed on the entire upper surface of the semiconductor substrate 1 including an area formed with the integrated circuit. A metal under layer 4a made of metal such as copper is formed on the entire upper surface of the under-layer insulating film 3. A metal upper layer 4b made of metal such as copper is formed on the entire upper surface of the metal under layer 4a. As seen from FIG. 1B, the under layer 4a and the upper layer 4b constitute a stacked metal layer structure, and form a ground layer (common potential layer) 5, which is supplied with a ground potential (voltage).

On the upper surface of the ground layer 5 are provided a plurality of circular metal under layers 6a made of metal such as copper at its peripheral portion (in a peripheral region of the semiconductor substrate 1). The metal layers 6a are formed with a predetermined interval along the peripheral sides of the ground layer 5. An metal upper layer 6b is formed on the entire upper surface of each of the metal under layers 6a. The under layer 6a and the upper layer 6b constitute a stacked structure, and form a ground connection pad 7. The upper surface of each of the ground connection pads 7 is provided with a ground columnar electrode 8 for grounding made of a metal such as copper. The ground connection pad 7 and the corresponding ground columnar electrode 8 form a common potential electrode.

In a central area on the upper surface of the ground layer 5 is formed with a square (or rectangular) insulating film 9. The insulating film 9 is formed of a ferroelectric material such as $Ta_2O_3$, STO or BST. The upper surface of the insulating film 9 is provided with five rectangular and/or square metal under layers 10a made of a metal such as copper. The metal layers 10a are formed separating from each other. An metal upper layer 10b is formed on the entire upper surface of each of the metal under layers 10a. The under layer 10a and the upper layer 10b form a top electrode (conductor) 11 having a stacked structure. In this case, five top electrodes 11 may have the same or different plane size.

Five thin-film capacitive elements (thin-film circuit elements) 2 are composed of the top electrodes 11, the common ferroelectric film 9 formed under the top electrodes, and the common bottom electrode composed of the ground layer 5 formed under the electrically insulating film 9. The ground layer 5 formed below the top electrode 11 is used in common to said plurality of thin-film capacitive elements, and also, functions as the bottom electrode.

The upper surface of the top electrode 11 of the thin-film capacitive element 2 is provided with one or more columnar electrodes 12 for thin-film circuit elements, each made of a conductor such as copper. The conducting columnar electrodes 12 of the thin-film capacitive elements 2 are arranged so that the pitch becomes approximately equal. The upper surface of an assembly having the foregoing structure is provided with a sealing film 13 made of an insulating material such as an epoxy resin around the columnar electrodes 8 and 12. The sealing film 13 is formed to be flush with the upper surfaces of the columnar electrodes 8 and 12. The upper surfaces of the columnar electrodes 8 and 12 are respectively provided with ground conductors or solder balls (ground solder layers) 14, and element conductors or solder balls (element solder layers) 15.

In the foregoing semiconductor device, the ground layer formed on the upper surface of the semiconductor substrate functions as the common bottom electrode 5 of the capacitive elements 2. Said plurality of, for example five top electrodes 11 are formed on the bottom electrode 5 via the common insulating film 9. By doing so, five thin-film capacitive elements 2 are formed on the semiconductor substrate 1. Therefore, packaging density is made high, and moreover, the layer structure of each thin-film circuit element 2 is given as three layers, that is, the ground layer 5 functioning as the bottom electrode, the insulating film 9 and the top electrode 11. This serves to reduce the number of layers, as a result, the number of manufacturing processes may be reduced.

Second Embodiment

FIG. 2A is a transparency plan view showing a semiconductor device according to a second embodiment of the present invention. FIG. 2B is a cross-sectional view taken along the line $II_B$-$II_B$ of FIG. 2A. The semiconductor device largely differs from that shown in FIGS. 1A and 1B in the following point. On the upper surface of the insulating film 9 is provided a plurality, for example, six, spiral thin-film inductive elements 21 in place of the thin-film capacitive elements 2.

The insulating film 9 is formed of a polyimide resin. Each of the thin-film inductive elements 21 includes a patterned conductor 23 having a stacked structure. The conductor 23 is constructed by a metal under layer 22a and a metal upper layer 22b formed thereon. The under layer 22a is made of a metal such as copper, and spirally or windingly formed on the upper surface of the insulating film 9. The upper layer 22b is made of a metal such as copper, and formed on the entire upper surface of the under layer 22a. The conductor 23 is spirally or windingly formed in its plane. One end or inner end of the elongated conductor 23 is electrically connected to the upper surface of the ground layer 5 via an opening or through hole 24 formed in the insulating film 9. The other end or outer end of the elongated conductor 23 is electrically and mechanically connected to a circular connection pad 26 for a thin-film circuit element, having a stacked structure. The connection pad 26 is composed of a metal under layer 25a and an metal upper layer 25b, stacked thereon. The under layer 25a is made of a metal such as copper, and formed on the upper surface of the insulating film. The upper layer 25b is made of a metal such as copper, and formed on the entire upper surface of the under layer 25a. The circular connection pad 26 and elongated conductor 23 may be integrally or separately formed with each other.

The upper surface of the connection pad 26 is provided with a conducting columnar electrode 12 for connecting to a thin-film circuit element 21. The upper surface of the conducting columnar electrode 12 is provided with a solder ball 15.

In the foregoing semiconductor device, the plurality of, for example, six, conductors 23 are spirally formed on the common ground layer 5 formed on the upper surface of the semiconductor substrate 1 via the insulating film 9. By doing so, six thin-film inductive elements (inductors) 21 are formed in the central area of the semiconductor substrate 1. Therefore, packaging density may be made high, and moreover, the layer structure of each circuit element 21 is given as three layers, that is, the common ground layer 5, the insulating film 9 and the conductor 23. This serves to reduce the number of layers; as a result, the number of manufacturing processes may be reduced.

Third Embodiment

Figure 3A:
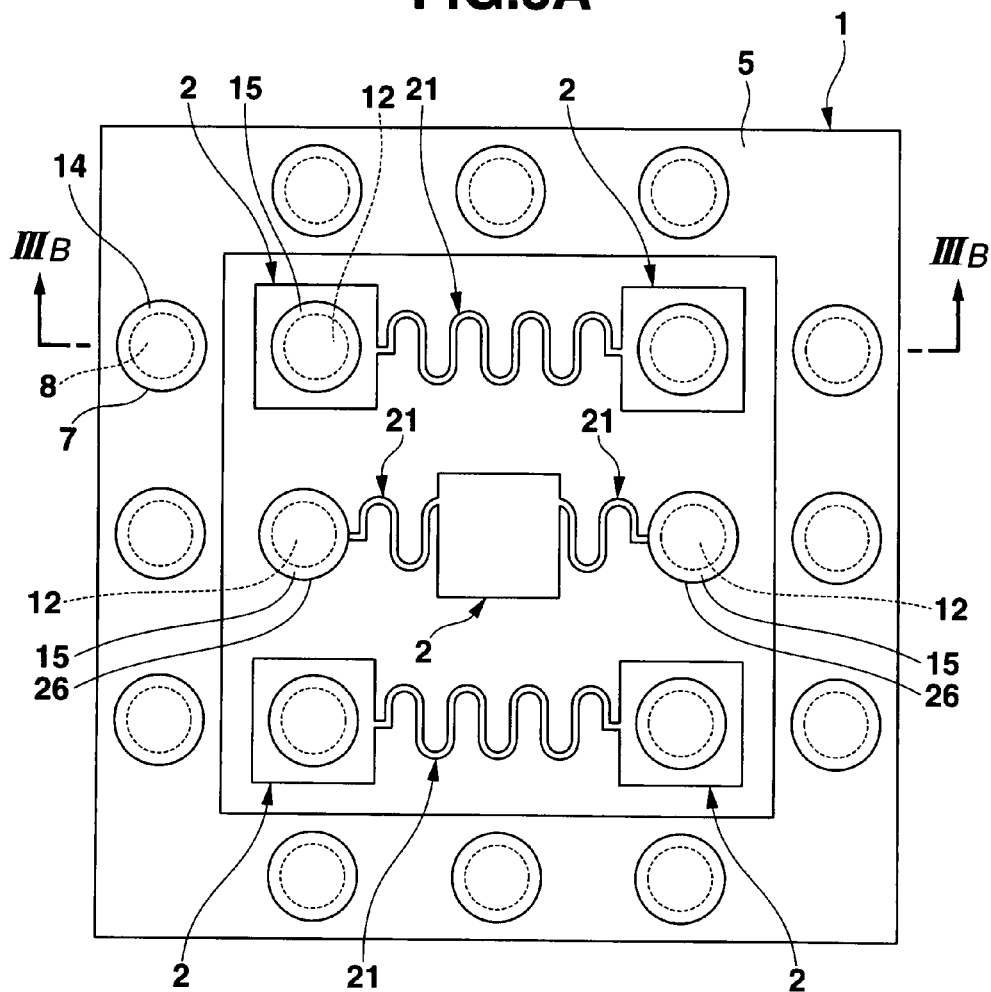
FIG. 3A is a transparency plan view showing a semiconductor device according to a third embodiment of the present invention.
Figure 3B:
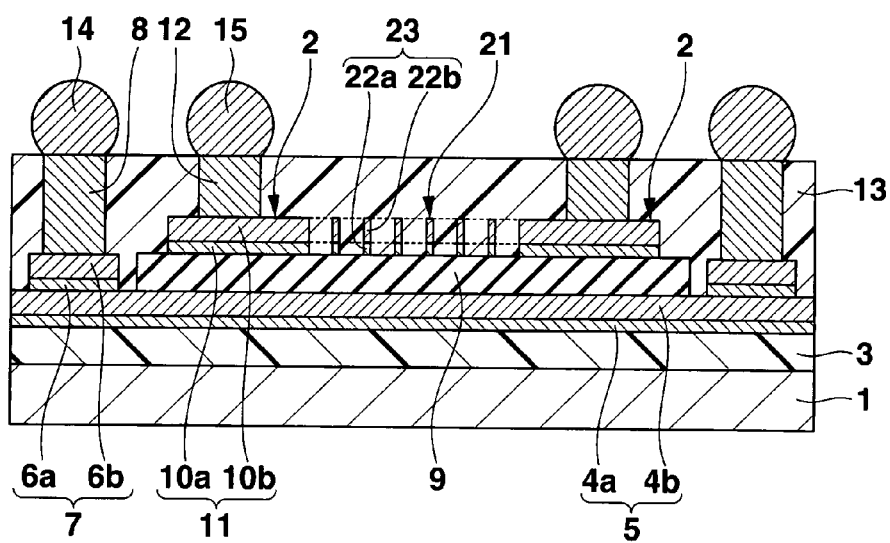
FIG. 3B is a cross-sectional view taken along the line $III_B$-$III_B$ of FIG. 3A.

FIG. 3A is a transparency plan view showing a semiconductor device according to a third embodiment of the present invention. FIG. 3B is a cross-sectional view taken along the line $III_B$-$III_B$ of FIG. 3A. The semiconductor device largely differs from that shown in FIGS. 1A and 1B in the following point. Specifically, on the upper surface of the insulating film 9 is provided a plurality of, for example, four winding or mindering thin-film inductive elements 21, in addition to the plurality of, for example, five, thin-film capacitive elements 2.

In this case, the insulating film 9 is formed of ferroelectric materials such as $Ta_2O_3$, STO and BST. Five top electrodes 11 form five thin-film capacitive elements 2 including an insulating film and ground layer 5. In FIG. 3A, these five thin-film capacitive elements 2 are arranged at upper left, upper right, center, lower left and lower right. Four windingly formed interconnects 23 forms thin-film capacitive element 21. The upper surface of the top electrode 11 of the thin-film capacitive element 2 is provided with an element columnar electrode 12. In FIG. 3A, the left end portion of the thin-film inductive elements 21 provided at upper and lower side is connected to the thin-film capacitive element 2 arranged at the left side. The right end portion of the thin-film inductive elements 21 is connected to the thin-film capacitive element 2 arranged at the right side.

In FIG. 3A, the thin-film capacitive element 2 provided in the center is connected with one end of each of two thin-film inductive elements 21 provided at its right and left sides. The other end of each of two thin-film inductive elements 21 is connected to each of two element connection pads 26 provided at its right and left sides (FIG. 3B).

In the semiconductor device, a plurality of, for example, five top electrodes 11 are formed on the common ground layer 5 formed on the semiconductor substrate 1 via the insulating film 9. By doing so, a plurality of, for example, five thin-film capacitive elements 2 are configured. Moreover, a plurality of, for example, four, conductors 23 are windingly formed on the common ground layer 5 via the insulating film 9. By doing so, four thin-film inductive elements 21 are configured. Therefore, packaging density is made high, and moreover, the layer structure is given as three layers, that is, the ground layer 5 functioning as the bottom electrode, the insulating film 9 and the top electrode 11 or conductor 23. This serves to reduce the number of layers; as a result, the number of manufacturing processes may be reduced.

In the foregoing embodiments, the layer 5 functions as a common (shared) potential layer having power supply (Vdd) potential (voltage). The thin-film circuit element provided on the insulating film 9 may be a thin-film resistive element in addition to a thin-film capacitive element including the grand layer 5, spiral thin-film inductive element, winding thin-film inductive element. Moreover, these elements may be combined.

In the foregoing embodiments, each of the ground layer 5, the ground connection pad 7, the top electrode 11, the conductor 23 and the connection pad 26 has a two-layer stacked structure comprising metal upper and lower layers. A stacked structure comprising three or more metal layers may be given, or a single metal layer may be given.

In the foregoing embodiments, the thin-film circuit element is formed on the semiconductor substrate formed with the integrated circuit. The present invention is applicable to the case where the thin-film circuit element is formed on the following substrates formed with no integrated circuit. The substrates may include a silicon substrate and substrate comprising glass fiber base material epoxy resin ceramic or alumina.

In the foregoing embodiments, members only forming the thin-film circuit element are basically formed on the insulating film 9. Interconnect pattern may be formed together with members forming the thin-film circuit element. The interconnect pattern is used for connecting the thin-film circuit element to circuits (including integrated circuit) formed on the substrate and outside circuits.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A chip-type electronic component comprising:
a substrate;
a common potential layer formed on an upper side of the substrate;
an insulating film formed on the common potential layer, and provided to expose at least part of the common potential layer;
at least one common potential electrode provided on the part of the common potential layer;
a plurality of conductors provided on the insulating film, each of the conductors being constituted as a part of a thin-film circuit element;
at least one conducting columnar electrode electrically connected to at least one of the conductors; and
a sealing film formed around the conducting columnar electrode.

2. The component according to claim 1, wherein the substrate includes a semiconductor substrate having an integrated circuit.

3. The component according to claim 1, wherein the common potential layer is provided on the entire upper side of the substrate, and the common potential electrode is provided on a peripheral area of the common potential layer, and the insulating film is provided in a center area of the common potential layer, enclosed by the peripheral area.

4. The component according to claim 1, wherein each of the thin-film circuit elements includes a thin-film capacitive element including the conductor, the common potential layer, and the insulating film provided between the conductor and the common potential layer.

5. The component according to claim 1, wherein each of the conductors includes a metal lower layer and a metal upper layer.

6. The component according to claim 1, wherein each of the thin-film circuit elements includes a thin-film inductive element comprising a conductor element, which is spirally formed on the insulating film.

7. The component according to claim 6, wherein each of the conductor elements includes a metal lower layer and a metal upper layer.

8. The component according to claim 6, wherein one end of the thin-film inductive element is connected to the conducting columnar electrode, and the other end thereof is connected to the common potential layer via an opening formed in the insulating film.

9. The component according to claim 1, wherein each of the thin-film circuit elements includes a thin-film inductive element comprising the conductor windingly formed on the insulating film.

10. The component according to claim 9, wherein each of the conductors includes a metal lower layer and a metal upper layer.

11. The component according to claim 1, wherein said at least one common potential electrode includes a ground connection pad provided on the common potential layer and a ground columnar electrode provided on the ground connection pad.

12. The component according to claim 1, wherein said plurality of thin-film circuit elements are the same kind of circuit elements.

13. The component according to claim 1, wherein said plurality of thin-film circuit elements are different kinds of circuit elements.

14. The component according to claim 1, wherein upper surfaces of the common potential electrode and the conducting columnar electrode are respectively provided with solder layers.

* * * * *